(12) United States Patent
Chen et al.

(10) Patent No.: US 6,392,952 B1
(45) Date of Patent: May 21, 2002

(54) MEMORY REFRESH CIRCUIT AND MEMORY REFRESH METHOD

(75) Inventors: Juei-Lung Chen; Shih-Huang Huang, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/855,977

(22) Filed: May 15, 2001

(51) Int. Cl.[7] .................................................. G11C 8/00
(52) U.S. Cl. ................................ 365/230.03; 365/222
(58) Field of Search ............................. 365/230.03, 222

(56) References Cited

U.S. PATENT DOCUMENTS 4,333,167 A * 6/1982 McElroy ..................... 365/222
4,631,701 A * 12/1986 Kappeller et al. ........... 365/222

* cited by examiner

Primary Examiner—Trong Phan

(57) ABSTRACT

A memory refresh circuit is connected to a plurality of block memories via a plurality of word line drivers respectively connected to the block memories. The memory refresh circuit comprises a plurality of row address latches, a plurality of row address strobe monitors, and a row address counter. Each of the row address latches is respectively paired by electrical connection with one of the row address strobe monitors, and each pair of row address latches and row address strobe monitors is respectively connected to one of the block memories. The row address counter is connected to the row address latches to which it transmits a plurality of different row addresses. When a memory refresh signal is delivered to one of the row address strobe monitors, the corresponding row address latch latches the address to be refreshed to perform the refresh operation.

12 Claims, 5 Drawing Sheets

MEMORY REFRESH CIRCUIT AND MEMORY REFRESH METHOD

BACKGROUND OF THE INVENTION

1. Field of the Invention

The present invention relates to the technology of memory module. More particularly, the present invention relates to a memory refresh circuit and a memory refresh method.

2. Description of the Related Art

A memory cell of a DRAM memory conventionally is composed of a transistor and a capacitor. Because the information is stored in the memory cell by charging the capacitor, the occurrence of a current leakage through the capacitor can negatively delete the stored information. In order to keep the stored information present in the memory cell, a conventional "refresh" operation thus is performed.

Referring to FIG. 1, a block diagram schematically illustrates a conventional memory refresh circuit. Each block memory 14a, 14b, 14c, etc. is respectively connected to a corresponding word line driver (12a, 12b, 12c, etc.) and a decoder block (10a, 10b, 10c, etc). A row address counter 16 generates and transmits a row address to the decoder blocks (10a, 10b, 10c, etc.). A row address strobe monitor or timer ($T_{RAS}$) 18 is connected to the row address counter 16 and to the block memories (14a, 14b, 14c, etc.). The memory refresh operation is commanded by the delivery of a Column address strobe Before Row address strobe (CBR) memory refresh signal to the $T_{RAS}$ monitor 18. The $T_{RAS}$ monitor 18 then checks whether the refresh of all the block memories (14a, 14b, 14c, etc.) is completed before performing the next refresh operation. As a result, only a single CBR refresh operation can be performed within a memory refresh cycle.

Referring to FIG. 2, a time/sequence diagram illustrates a conventional memory refresh operation. At the time cycle T1, a memory refresh command is triggered by the activation of a CMD signal while the activation of the address signal XADD delivers the address XADD0 to be refreshed. A CBR refresh of the address XADD0 then starts. Once the refresh of the address XADD0 of all the block memories (14a, 14b, 14c, etc.) is completed, an activation of the CMD signal at the time cycle T7 commands another refresh operation with respect to another address XADD1.

With the above method, only a single CBR refresh operation thus can be performed within a memory refresh cycle. Moreover, while the size of the DRAM memory is increased, the retention time, on the contrary, cannot be unlimitedly increased. As a result, if more bits have to be refreshed within a fixed cycle as conventionally done, the repetitive sudden peaks of refresh currents can damage the power supply system.

SUMMARY OF THE INVENTION

A major aspect of the present invention is to provide a memory refresh circuit and a memory refresh method in which at least two refresh operations are performed within the same refresh cycle.

Another aspect of the present invention is to provide a memory refresh circuit and a memory refresh method in which the refresh current is better distributed during a time such that the failure of the power supply system can be prevented.

Another aspect of the present invention is to provide a memory refresh circuit and a memory refresh method in which the time necessary for a memory CBR refresh operation is reduced such that the utility rate of the memory is increased.

To attain the foregoing and other objectives, the present invention, according to a preferred embodiment, provides a memory refresh circuit that is connected to a plurality of block memories, each of the block memories being respectively connected to a word line driver. According to a preferred embodiment of the present invention, the memory refresh circuit comprises: a plurality of row address latches and a plurality of row address strobe monitors, each of the row address latches and one of the row address strobe monitors being connected to each other and to one of the block memories; and a row address counter connected to the row address latches to transmit a plurality of different addresses to the row address latches.

To attain the foregoing and other objectives, the present invention, according to another preferred embodiment, provides a memory refresh circuit that comprises: a memory array comprised of a plurality of block memories; a plurality of word line drivers respectively connected to each of the block memories, each of the word line drivers driving a word line selected in the corresponding block memory; a plurality of row address latches and a plurality of row address strobe monitors, each of the row address latches and one of the row address strobe monitors being both connected to each other and to one of the block memories via one of the word line drivers; and a row address counter connected to the row address latches to transmit a plurality of different addresses to the row address latches.

In the above preferred embodiments, the row address counter delivers successive addresses to each of the row address latches. When a memory refresh signal is transmitted to one of the row address strobe monitor for a specific address, the corresponding row address latch latches the corresponding address to perform the memory refresh operation.

To attain the foregoing and other objectives, the present invention, according to another preferred embodiment, provides a memory refresh method that comprises: generating a first memory refresh signal; generating an address signal; and latching the address signal to perform, according to the first memory refresh signal, a refresh operation to the address corresponding to the address signal while, at the same time, generating a second memory refresh signal, wherein the first and second memory refresh signals are within a same memory refresh cycle.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting. A major aspect of the present invention is to a synchronously perform the memory refresh, which is independently applied to different block memories of a DRAM memory that are independently accessible. Thus, at least two memory refresh operations can be performed within a single CBR refresh cycle.

Figure 3:
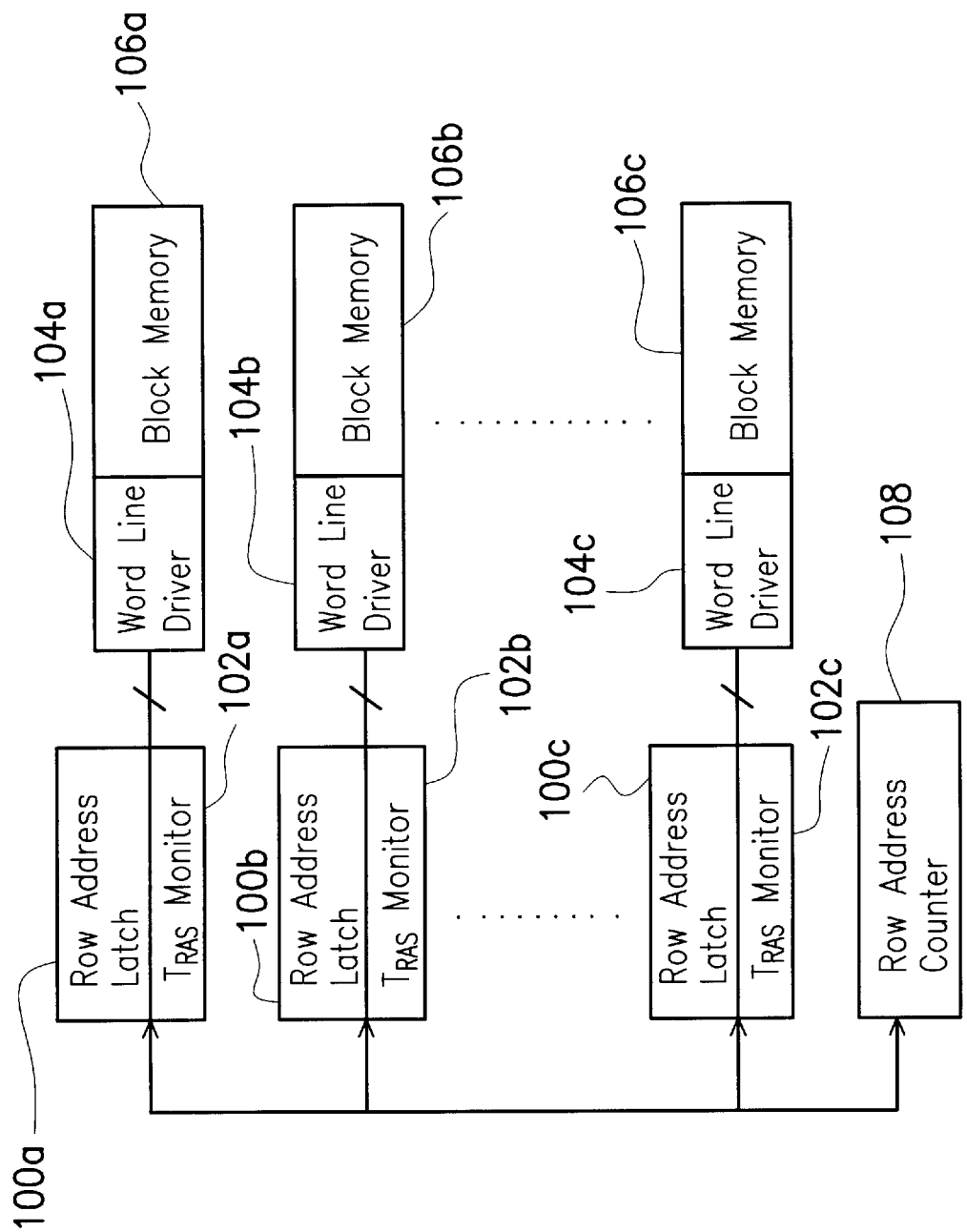
FIG. 3 is a block diagram schematically illustrating a memory refresh circuit according to a preferred embodiment of the present invention.

Referring to FIG. 3, a block diagram schematically illustrates a memory refresh circuit according to a preferred embodiment of the present invention. The DRAM memory is composed of a plurality of block memories (106a, 106b, 106c, etc.), wherein the size of each block memory is determined depending on the requirement of the design. Each of the block memories (106a, 106b, 106c, etc.) is respectively coupled with a corresponding word line driver (104a, 104b, 104c, etc.). Each of the word line drivers drives a word line selected within the corresponding memory block. The operation of a word line driver is well known in the art, so its description is omitted hereafter.

Each of the block memories (106a, 106b, 106c, etc.) is respectively connected to a row address latch (100a, 10b, 100c, etc.) and a row address strobe monitor ($T_{RAS}$) (102a, 102b, 102c, etc.). Each pair of row address latches (100a, 10b, 100c, etc.) and $T_{RAS}$ monitors (102a, 102b, 102c, etc.) are connected to a row address counter 108.

The row address counter 108 generates the addresses of the block memories to be refreshed. The address is calculated by, for example, sequentially incrementing, differentiating, and transmitting the row address to the row address latches (100a, 10b, 100c, etc.). When the row address latch 100a, for example, has received a row address, it is latched and does not receive any other row address. The $T_{RAS}$ monitor 102a then monitors the corresponding row address of the block memory 106a to determine whether it is being refreshed. If it is being refreshed, then the received row address is temporarily latched in the row address latch 100a. Once the corresponding row address of the block memory 106a is accessible, it is detected by the $T_{RAS}$ monitor 102a, which then transmits a signal to the row address latch 100a. The row address received by the row address latch 100a then is transmitted to the word line driver 104a to perform a CBR memory refresh operation of the block memory 106a.

A similar CBR memory refresh operation is a synchronously applied to the other memory blocks (106b, 106c, etc.). As a result, with all the block memories respectively connected to a $T_{RAS}$ monitor and a row address latch, the memory refresh operation can be efficiently performed because it is independently applied to each block memory. The $T_{RAS}$ monitor monitors the status of the row addresses and controls the refresh operation, while the row address latch temporarily stores the row address to be refreshed. With the association of the row address latches and the $T_{RAS}$ monitors to each block memory and the row address counter, at least two CBR refresh operations thus can be achieved within a single CBR refresh cycle.

Compared to the conventional technology, in which a single $T_{RAS}$ monitor is used, the present invention thus provides several advantages. Because the conventional method uses a single $T_{RAS}$ monitor, it is necessary to wait until all the block memories have completed a CBR refresh for a given address to perform a next address refresh operation. As a result, within a CBR refresh cycle, only a single CBR refresh operation of a single address can be performed with the conventional method. In contrast, because several memory refresh operations can be performed within a single refresh cycle, the present invention thus can reduce the time necessary for the refresh operation.

Figure 4:
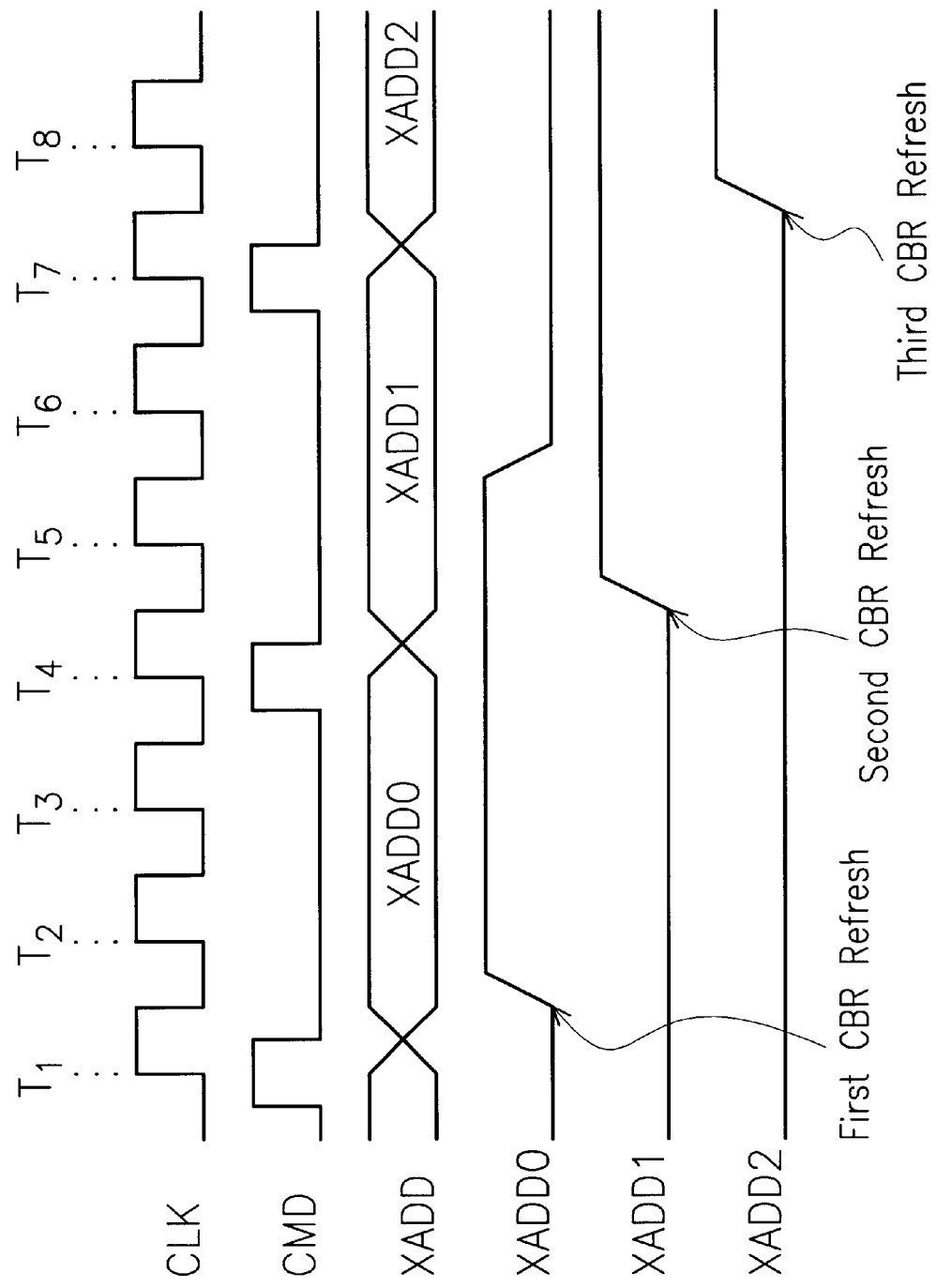
FIG. 4 is a time/sequence diagram of a memory refresh operation according to a preferred embodiment of the present invention.

Referring to FIG. 4, a time/sequence diagram schematically illustrates a memory refresh operation according to a preferred embodiment of the present invention. At the time cycle T1, an activated CMD signal commanding a refresh of the memory is output while the address XADD0 on which the refresh operation should be applied is output from the address signal output XADD. After the address XADD0 is latched by the row address latch, a first CBR refresh operation of the address XADD0 can start. The signal CMD thus can be activated to command a second refresh operation. In the example of FIG. 4, the command of a second refresh operation is activated by the signal CMD at the time cycle T4 while the address XADD1 is output from the address signal output XADD. After the address XADD1 is latched by the row address latch, the second refresh operation of the address XADD1 can start. At this moment, a third refresh operation can be commanded, which is done at the time cycle T7 with another activation of the signal CMD. The corresponding address XADD2 is output by the address signal output XADD, and after the address XADD2 is latched, the refresh operation thus starts.

Figure 1:
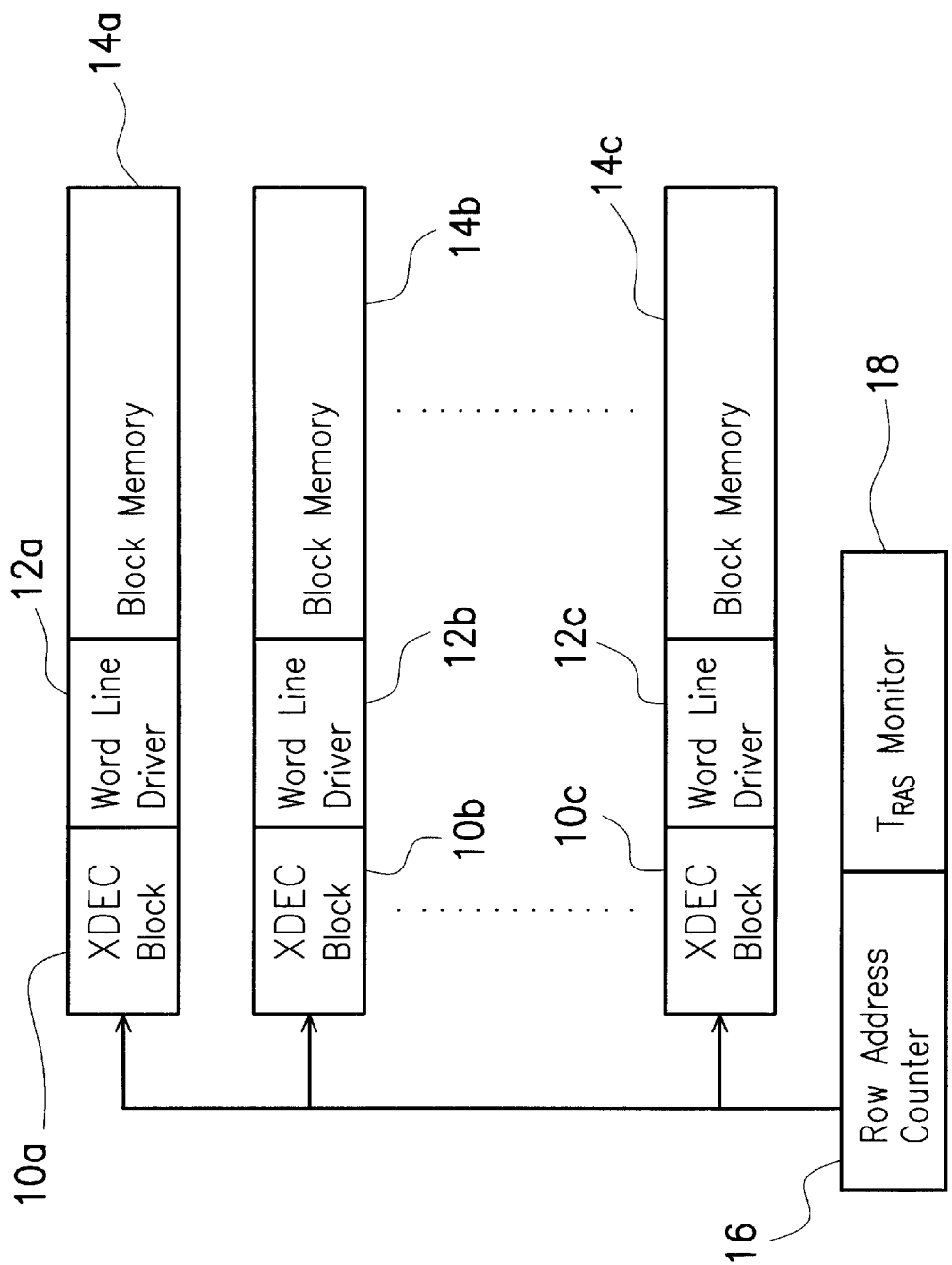
FIG. 1 is a block diagram schematically illustrating a conventional memory refresh circuit.
Figure 2:
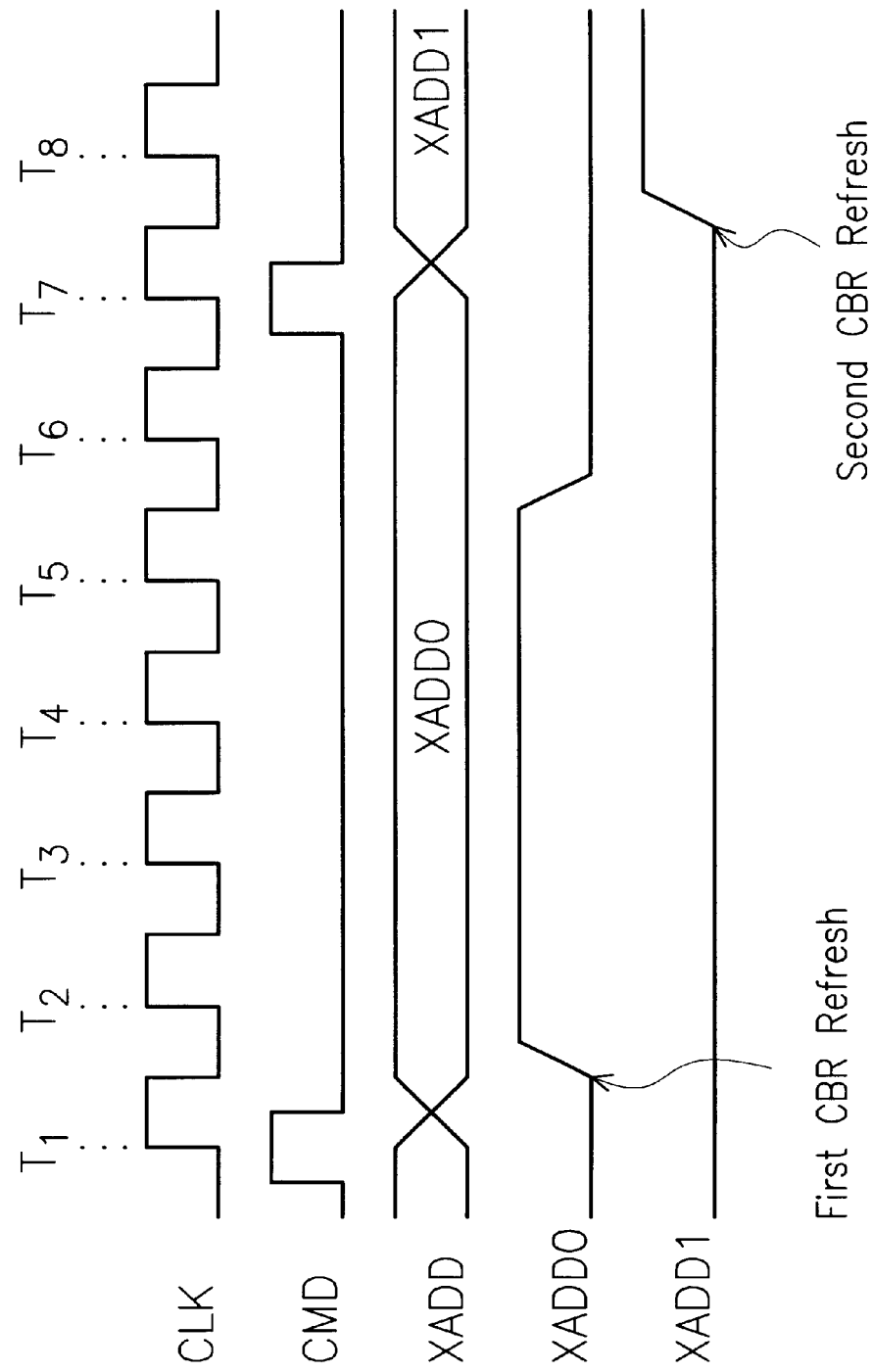
FIG. 2 is a time/sequence diagram of a conventional memory refresh operation.

The interval of time separating two consecutive refresh operations is reduced from the conventional 6 time cycles (T1 to T6 in FIG. 2) to 3 time cycles in the present invention (T1 to T3 in FIG. 4). As a result, the time is reduced by half, and the rate of the refresh operation for the same memory content is increased by double. Leakage current thus can be reduced.

Figure 5:
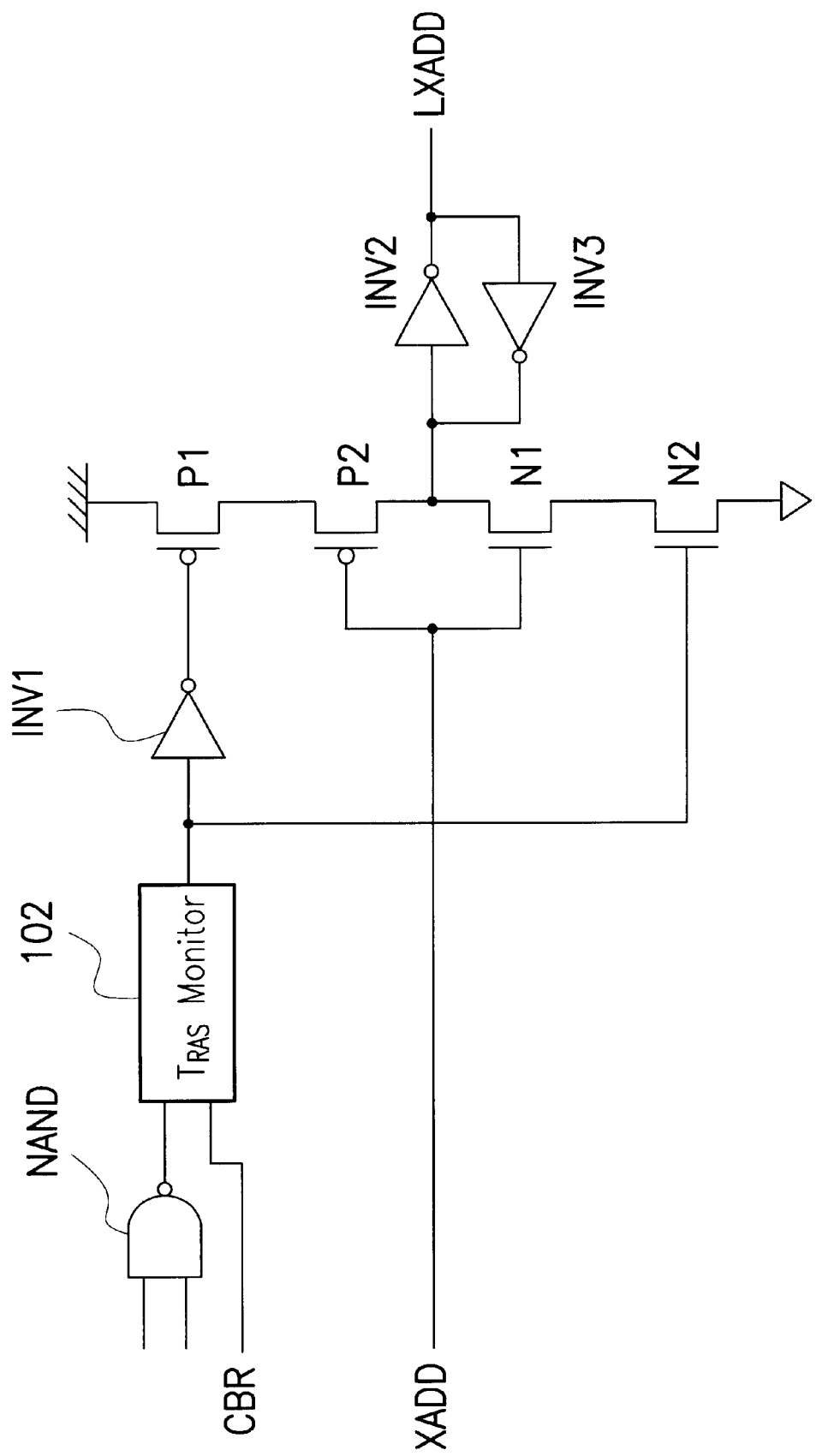
FIG. 5 is a circuit diagram schematically illustrating one of the row address latches and one of the $T_{RAS}$ monitors of FIG. 3 according to a preferred embodiment of the present invention.

In accordance with the above-description, a major aspect of the memory refresh circuit and the method for refreshing the memory of the present invention thus lies in the separated distribution of the refresh current and an overlap of the refresh operations to reduce the time necessary for a single refresh cycle of the whole memory. Referring to FIG. 5, a circuit diagram schematically shows the row address latch and $T_{RAS}$ monitor of FIG. 3 according to an embodiment of the present invention. FIG. 5 only shows a possible example of the circuit of the row address latch and $T_{RAS}$ monitor to implement the present invention, and modifications thereof can still be apparent to those skilled in the art within the scope of the present invention. FIG. 5 schematically shows the row address latch and the $T_{RAS}$ monitor 102 associated with each block memory in the present invention. The $T_{RAS}$ monitor 102 receives a block memory selection signal via a NAND gate and a CBR refresh signal. The $T_{RAS}$ monitor 102 outputs a switch signal respectively to a NMOS transistor N2 and, via an inverter INV1, to a PMOS transistor P1. The address signal XADD of the address to be refreshed is transmitted to the row address latch, formed by the inverters INV2 and INV3, via the gate electrode of a PMOS transistor P2 and NMOS transistor N1. When the $T_{RAS}$ monitor 102 has confirmed that a refresh operation of the address can be performed, a high voltage is output by the $T_{RAS}$ monitor 102 to the inverter INV1 and NMOS transistor N2 to switch on the PMOS transistor P1 and the NMOS transistor N2. Through the NMOS transistor N1, the address signal XADD then can be transmitted to the row address latch (INV2, INV3). Once the address XADD is latched in the row address latch (INV2, INV3), the CBR refresh operation starts while another command signal of the CBR refresh operation can be delivered to the $T_{RAS}$ monitor 102.

When the $T_{RAS}$ monitor 102 receives a command of the CBR refresh operation and if the refresh operation temporarily cannot be performed, the $T_{RAS}$ monitor 102 outputs a low voltage. As a result, the address signal XADD cannot be transmitted to the row address latch (INV2, INV3) through the gate electrode of the PMOS transistor P2 and the NMOS transistor N1. The $T_{RAS}$ monitor 102 continuously maintains the low voltage until the refresh operation can be performed. Then, the low voltage is turned into a high voltage and the address signal XADD can be transmitted to the row address latch (INV2, INV3), which then latches the transmitted address and triggers the word line driver to open the corresponding word line.

Compared to the conventional memory refresh circuit and memory refresh method, the memory refresh circuit and memory refresh method of the present invention can perform at least two refresh operations within a same refresh cycle, consequently improving efficiency. Because the time required for the memory CBR refresh operation is reduced in the present invention, the utility rate of the memory is increased. Moreover, because the refresh current is more uniformly distributed with the overlap of the refresh operations (instead of a conventional sudden peak refresh current after each refresh cycle), the failure of the power supply system advantageously can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory refresh circuit connected to a plurality of block memories, each block memory respectively connected to a word line driver, the memory refresh circuit comprising:
   a plurality of row address latches and a plurality of row address strobe monitors, wherein each of the row address latches is respectively paired by electrical connection with one of the row address strobe monitors, and each pair of row address latches and row address strobe monitors is respectively connected to a block memory; and
   a row address counter that is connected to each of the row address latches, the row address counter transmitting a plurality of different addresses to each of the row address latches, wherein when a memory refresh signal for a specific address is transmitted to one of the row address strobe monitors, the corresponding row address latch latches the address to perform a memory refresh operation.

2. The circuit device of claim 1, wherein each pair of row address latches and row address strobe monitors is respectively connected to one of the block memories via one of the word line drivers.

3. The circuit device of claim 1, wherein the memory refresh is a Column address strobe Before Row address strobe (CBR) memory refresh.

4. The circuit device of claim 1, wherein the number of row address latches and the number of row address strobe monitors are equal.

5. The circuit device of claim 1, wherein the different addresses transmitted by the row address counter to the row address latches are successive addresses.

6. A memory refresh circuit comprising:
   a memory array that comprises a plurality of block memories;
   a plurality of word line drivers that respectively are connected to the block memories to drive a word line selected within the block memories;
   a plurality of row address latches and a plurality of row address strobe monitors, wherein each of the row address latches is respectively paired by electrical connection with one of the row address strobe monitors, and each pair of row address latches and row address strobe monitors is respectively connected to one of the block memories via one of the word line drivers; and
   a row address counter that is connected to each of the row address latches, the row address counter transmitting a plurality of different addresses to each of the row address latches, wherein when a memory refresh signal for a specific address is transmitted to one of the row address strobe monitors, the corresponding row address latch latches the address to perform a memory refresh operation.

7. The circuit device of claim 6, wherein the memory refresh is a Column address strobe Before Row address strobe (CBR) memory refresh.

8. The circuit device of claim 6, wherein the number of row address latches and the number of row address strobe monitors are equal.

9. The circuit device of claim 6, wherein the different addresses transmitted by the row address counter to the row address latches are successive addresses.

10. A memory refresh method comprising:
    generating a first memory refresh signal;
    generating an address signal; and
    latching the address signal, such that a memory refresh is applied at the corresponding address while a second memory refresh signal is generated.

11. The method of claim 10, wherein the memory refresh is a Column address strobe Before Row address strobe (CBR) memory refresh.

12. The method of claim 10, wherein the first and second memory refresh signals are generated within a same memory refresh cycle.

* * * * *